April 14, 1964 T. W. COOPER 3,128,545
BONDING OXIDIZED MATERIALS
Filed Sept. 30, 1959
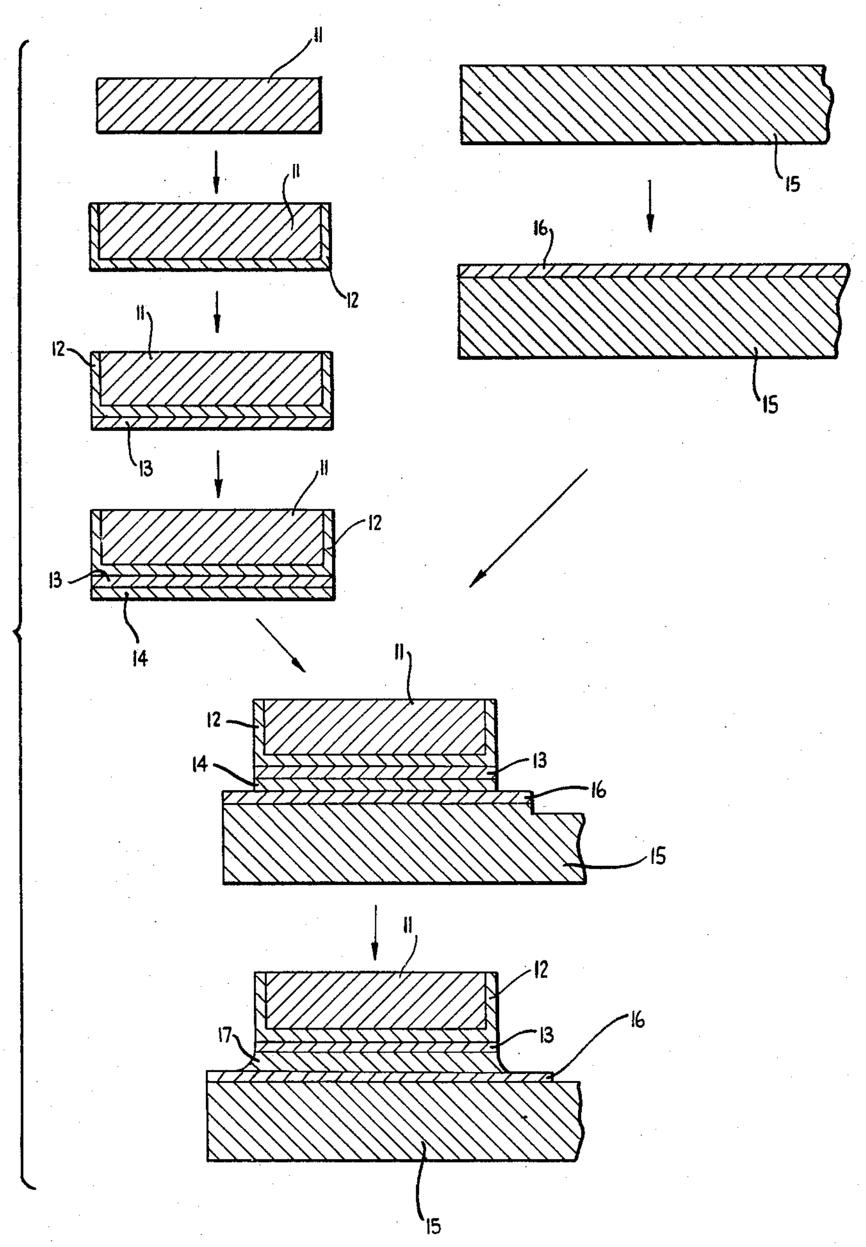
THEODORE W. COOPER,
INVENTOR
BY Charles S. Haughey
ATTORNEY 3,128,545
Patented Apr. 14, 1964

3,128,545

BONDING OXIDIZED MATERIALS

Theodore W. Cooper, Torrance, Calif., assignor to Hughes Aircraft Company, Culver City, Calif., a corporation of Delaware Filed Sept. 30, 1959, Ser. No. 843,467
6 Claims. (Cl. 29—472.7)

This invention relates to the formation of a bond to an oxidized surface More particularly, the invention relates to formation of an electrically insulating bond or contact to a silicon semiconductor crystal with substantially no penetration of the crystal Silicon semiconductor crystals include crystals of silicon, and predominantly silicon crystals containing other materials such as germanium or type determining doping materials in such minor amounts as to make the crystal react physically and chemically as a substantially pure silicon crystal. Such crystals have known properties such as relatively high melting temperatures, resistance to wetting by some soldering materials, and a tendency to form relatively deep penetrations with usual alloying or alloy bonding materials for semiconductor fabrication art, such as gold, silver, and the like. This penetration is due to formation of a liquid solution, or the dissolution of the silicon crystal by the alloying material, when heated, so that upon cooling the alloy bond has penetrated the crystal structure. Such alloying materials as are conventionally used in silicon semiconductor device fabrication require cleaning of the silicon crystal until it is free from oxide materials, because they do not properly wet the oxide film. They are not satisfactory for attachment to an oxidized surface such as oxidized silicon, oxidized molybdenum, ceramic or glass.

In semiconductor device fabrication it is often desirable to attach a silicon semiconductor crystal to a heat sink, a heat radiator, or a support without penetration of the crystal. This is of particular importance when using thin crystal elements. It is often desirable to reduce or eliminate electrical conductance through the bond as well as to avoid crystal penetration.

The object of this invention is the formation of a strong, reliable contact or bond between two bodies, such as between a silicon semiconductor crystal and a crystal support or a heat sink, which bond is electrically insulating and non-penetrating and may be formed at temperatures which are not injurious to the bodies, and the preparation of an intermediate coated body or crystal to which alloy bonding procedures may be applied.

The above and other objects and advantages of this invention will be explained by or made apparent from the following disclosure and the preferred embodiment as illustrated in the drawing, in which:

The single figure illustrates schematically a process for forming a bond between a silicon semiconductor crystal and a support made according to this invention.

In the preferred embodiment as illustrated in the drawing, a silicon semiconductor crystal is bonded to a support. The crystal is initially oxidized by any suitable method, such as heating in an oxidizing atmosphere; or it may be coated with an oxide film such as silica, for example, by vaporizing silica from a heating element in a vacuum system to cause the silica to condense as a film on the crystal. A germanium film is then formed on the oxidized crystal surface and on the support surface, as by a vacuum evaporation step or a plating process. An alloy material such as silver, gold, silver-gold alloy, aluminum, copper and alloys of such materials with germanium, which in molten form wets and dissolves germanium and forms a bond therewith when cooled, hereinafter often called a germanium alloy bonding material, is then placed on one of the germanium films.

Alternatively the material may be assembled between the germanium films in powder or foil form. The assembly is then heated to fusion temperature under sufficient pressure to form an alloy bond upon cooling.

A silicon semiconductor crystal 11, as shown in the process sequence drawing, is oxidized as by exposure to an oxidizing atmosphere at elevated temperature to form an oxide film 12 thereon. Oxide films of two-tenths micron thickness have been satisfactorily used. The crystal 11 may alternatively be coated with film of silicon dioxide or such other oxide or glass as may be tolerated by the semiconductor.

The oxide coated crystal is then coated with a film 13 of germanium on the surface where a bond is to be formed. A support 15 such as ceramic, glass, or a metallic heat sink (which may also be oxidized) is also coated with a germanium film 16. It is preferred to form the germanium films by forming a vacuum about the surfaces to be coated, heating germanium to be vaporized in a heating element within the vacuum, and thus vapor coating the surfaces to be bonded. Known masking techniques may be used to define the areas coated by the germanium.

The bond formed between germanium and an oxidized surface is a non-penetrating bond and an electrically insulating bond relative to the oxidized member. Certain germanium alloys, such as germanium-gold, have the property of wetting an oxide film, especially silicon oxide, and forming a heat conducting bond thereto.

The thickness of the germanium film should be from about one tenth micron to several microns, depending upon the nature of the bond to be made, and whether all deposited germanium is to be dissolved into a germanium rich alloy, or only the surface thereof. One of the germanium coated surfaces to be bonded is next coated with a germanium alloy bonding material 14 such as gold. Either one or both germanium films may be coated with the alloying material film, or alloying material may be assembled between the germanium films in foil or powder form during bonding. The crystal is assembled on the support in the position in which it is to be bonded, with alloying material 14 between two films 13, 16 of germanium material, and such pressure is applied as is necessary to maintain this assembly. The assembly is then heated to the alloying material-germanium fusion temperature to fuse the material to each adjacent germanium film and form a coherent bond 17 which may or may not penetrate to the oxide films.

The bond formed by the above disclosed process does not penetrate the silicon crystal in silicon semiconductor crystal devices, hence is peculiarly useful in such devices. It is also apparent that the intermediate material consisting of a silicon semiconductor crystal having an oxide coating with a germanium film thereon has a wide variety of uses such as an assembly element for attachment to metallic heat sinks, or an element for attachment to a ceramic or glass support.

Certain solders are also peculiarly useful in joining germanium but are less satisfactory for joining silicon because of their peculiar characteristics of expansion with temperature, strength and brittleness. Many preferred solders for bonding to germanium are known in the art and may be used to join the germanium films formed according to this invention.

What is claimed is:

1. The method of forming an electrically insulating, thermally conducting and non-penetrating bond to a silicon semiconductor crystal, which comprises: coating a surface of the crystal with a layer of silicon oxide; vapor coating the oxide on said surface with a film of germanium; and alloy bonding a thermally conducting body to said germanium film.

2. The method of forming an electrically insulating, non-penetrating bond between a silicon semiconductor crystal and a body, which comprises: forming a layer of silicon oxide on a surface of said crystal; coating said silicon oxide layer and a surface of said body with a film of germanium; and alloy bonding said germanium films to each other.

3. The method of forming an electrically insulating, non-penetrating bond between a silicon semiconductor crystal and a body, which comprises: forming an oxide layer on a surface of said crystal; coating said oxide layer and a surface of said body with a film of germanium; forming a film of germanium alloy bonding material on at least one of said germanium films; contacting said coated surfaces under pressure; and heating said contacted surfaces to alloy bond the germanium films to each other.

4. The method according to claim 3 wherein the germanium alloy bonding material is a material of the group consisting of gold, silver, and silver-gold alloy, gold-germanium, silver-germanium.

5. The method of joining solid bodies, which comprises: depositing a film of germanium on the surfaces of each body to be joined; depositing a film of germanium bonding alloy material on at least one of said germanium films; joining said surfaces under pressure; and heating said joined surfaces to at least the fusion temperature of said material with germanium.

6. The method of joining solid bodies, which method comprises: depositing a film of germanium at least one tenth micron thick on the surfaces of each body to be joined by forming a vacuum about said surfaces and vaporizing germanium material in said vacuum whereby to vacuum coat said surfaces with a germanium film of the desired thickness; depositing a film of germanium alloy bonding material of the class composed of silver, gold, aluminum, silver-gold alloy, silver germanium alloy and gold germanium alloy on at least one of said germanium films by forming a vacuum about said germanium film, vaporizing said material in said vacuum whereby to coat said germanium film with a film of said material; joining said surfaces under sufficient pressure to maintain contact thereof; and heating said joined surfaces to at least the fusion temperature of said material with germanium whereby to provide a bond.

References Cited in the file of this patent

UNITED STATES PATENTS

| | | |
|---|---|---|
| 2,163,409 | Pulfrich | June 20, 1939 |
| 2,243,979 | Reynolds | June 3, 1941 |
| 2,397,744 | Kertesz | Apr. 2, 1946 |
| 2,480,711 | Calton | Aug. 20, 1949 |
| 2,763,822 | Frola | Sept. 18, 1956 |
| 2,824,269 | Ohl | Feb. 18, 1958 |
| 2,975,078 | Rayfield | Mar. 14, 1961 |